US006821338B2

(12) United States Patent
Reade et al.

(10) Patent No.: US 6,821,338 B2
(45) Date of Patent: Nov. 23, 2004

(54) PARTICLE BEAM BIAXIAL ORIENTATION OF A SUBSTRATE FOR EPITAXIAL CRYSTAL GROWTH (75) Inventors: Ronald P. Reade, Berkeley, CA (US); Paul H. Berdahl, Walnut Creek, CA (US); Richard E. Russo, Walnut Creek, CA (US)

(73) Assignee: The Regents of the University of California, Oakland, CA (US)

( * ) Notice: Subject to any disclaimer, the term of this patent is extended or adjusted under 35 U.S.C. 154(b) by 111 days.

(21) Appl. No.: 09/739,391

(22) Filed: Dec. 15, 2000

(65) Prior Publication Data

US 2002/0073918 A1 Jun. 20, 2002

(51) Int. Cl.⁷ .................................................. C30B 1/06
(52) U.S. Cl. .................. 117/4; 117/7; 117/16; 117/944; 117/945; 117/941
(58) Field of Search .......................... 117/4, 7, 10, 944, 117/945, 941

(56) References Cited

U.S. PATENT DOCUMENTS

| 4,776,925 | A |   | 10/1988 | Fossum et al. |         |
|-----------|---|---|---------|---------------|---------|
| 5,246,741 | A |   | 9/1993  | Ouhata et al. |         |
| 5,262,394 | A |   | 11/1993 | Wu et al.     |         |
| 5,372,089 | A |   | 12/1994 | Yoshida et al.|         |
| 5,432,151 | A |   | 7/1995  | Russo et al.  | 505/474 |
| 5,601,654 | A |   | 2/1997  | Springer      |         |
| 5,607,781 | A |   | 3/1997  | Okuno et al.  |         |
| 5,650,378 | A |   | 7/1997  | Iijima et al. | 505/473 |
| 5,872,080 | A |   | 2/1999  | Arendt et al. | 505/238 |
| 6,033,471 | A |   | 3/2000  | Nakanishi et al. |      |
| 6,060,375 | A |   | 5/2000  | Owyang et al. | 438/585 |
| 6,190,752 | B1|   | 2/2001  | Do et al.     |         |
| 6,258,472 | B1|   | 7/2001  | Neumuller et al. |      |
| 6,312,819 | B1| * | 11/2001 | Jia et al.    | 428/450 |
| 6,337,991 | B1| * | 1/2002  | Li et al.     | 505/161 |
| 6,498,549 | B1|   | 12/2002 | Jiang et al.  |         |
| 6,537,689 | B2|   | 3/2003  | Schoop et al. |         |
| 2001/0006042 | A1 | | 7/2001 | Iijima et al. |         |
| 2002/0017235 | A1 | | 2/2002 | Nagasaka et al. |     |
| 2002/0041973 | A1 | | 4/2002 | Belouet       |         |

FOREIGN PATENT DOCUMENTS

| JP | 01215966 A | 9/1989  |
| JP | 07-065642  | 10/1995 |
| WO | 98/58415   | 6/1998  |
| WO | 99/16941   | 9/1998  |
| WO | 99/17307   | 9/1998  |
| WO | 00/58044   | 1/2000  |
| WO | 00/58530   | 3/2000  |

(List continued on next page.)

OTHER PUBLICATIONS

Mao et al., "Study on the growth of biaxially aligned yttria–stabilized zirconia films during ion bem assisted deposition", J. vac. Sci. Technolo. A 15(5) Sep./Oct. 1997 pp. 2687–2692.*

(List continued on next page.)

Primary Examiner—Robert Kunemund
(74) Attorney, Agent, or Firm—John P. O'Banion (57) ABSTRACT The invention provides a method of increasing the extent of a desired biaxial orientation of a previously formed non-single-crystal structure by contacting said structure with an oblique particle beam thereby forming in the structure a nucleating surface having increased desired biaxial orientation. The method can further include a step of epitaxially growing the crystalline formation using the nucleating surface to promote the epitaxial growth. The invention also provides a crystalline structure containing a nucleating surface formed by contacting a previously formed non-single-crystal structure with an oblique particle beam, from 0 to 10 adjacent orientation-transmitting layers, and a crystalline active layer. In this structure, the active layer is oriented in registry with the nucleating surface.

42 Claims, 5 Drawing Sheets

FOREIGN PATENT DOCUMENTS

| WO | 01/08169 | 7/2000 |
|---|---|---|
| WO | 01/08170 | 7/2000 |
| WO | 01/08231 | 7/2000 |
| WO | 01/08232 | 7/2000 |
| WO | 01/08233 | 7/2000 |
| WO | 01/08235 | 7/2000 |
| WO | 01/08236 | 7/2000 |
| WO | 01/11428 | 7/2000 |
| WO | 01/15245 | 7/2000 |
| WO | 01/26164 | 7/2000 |
| WO | 01/26165 | 7/2000 |

OTHER PUBLICATIONS

Berdahl, P., et al., "Angular Magnetoresistance Provides Texture Information on High–$T_c$ Conductors", *Physica C*, 195, 1992, pp. 93–102.

Bradley, Mark R., et al., "Theory of Thin–Film Orientation by Ion Bombardment during Deposition", *J. Appl. Phys.* 60 (12), Dec. 15, 1986, pp. 4160–4164.

Dimos, D., et al., "Superconducting Transport Properties of Grain Boundaries in $YBa_2Cu_3O_7$ Bicrystals", *Physical Review B*, vol. 41, No. 7, Mar. 1, 1990, pp. 4038–4049.

Dobrev, D., "Ion–Beam–Induced Texture Formation in Vacuum–Condensed Thin Metal Films", *Thin Solid Films* 92, 1982, pp. 41–53.

Fork, D.K., et al., "High Critical Currents in Strained Epitaxial $YBa_2Cu_3O_{7-\delta}$ on Si", *Appl. Phys. Lett.* 57 (11), Sep. 10, 1990, pp. 1161–1163.

Garrison, S.M., et al., "Observation of Two In–Plane Epitaxial States in $YBa_2Cu_3O_{7-\delta}$ Films on Yttria–Stabilized $ZrO_2$", *Appl. Phys. Lett.* 58 (19), May 13, 1991, pp. 2168–2170.

Iijima, Y., et al., "Biaxially Aligned YSZ Buffer Layer on Polycrystalline Substrates", paper prepared for Proceedings of the Fourth International Symposium on Superconductivity, Tokyo, Japan, Oct. 14–17, 1991, pp. 1–4.

Iijima, Y., et al., "In–Plane Aligned $YBa_2Cu_3O_{7-x}$ Thin Films Deposited on Polycrystalline Metallic Substrates", *Appl. Phys. Lett.* 60 (6), Feb. 10, 1992, pp. 769–771.

Jia, Q.X., et al., "Sputter Deposition of $YBa_2Cu_3O_{7-x}$ Films on Si at 500° C with Conducting Metallic Oxide as a Buffer Layer" *Appl. Phys. Lett.* 57 (3), Jul. 16, 1990, pp. 304–306.

Kumar, Ashok, et al., Synthesis of Superconducting $YBa_2Cu_3O_{7-\delta}$ Thin Fims on Nickel–Based Superalloy Using In Situ Pulsed Laser Deposition, *Appl. Phys. Lett.* 57 (24), Dec. 10, 1990, pp. 2594–2596.

Lioutas, Ch.B., et al., "Phase Transformation of Hydrogen Free Amorphous Carbon Films under Ion Beam Bombardment", *Carbon*, vol. 36, No. 5–6, 1998, pp. 545–548.

Mizutani, T., "Compositional and Structural Modifications of Amorphous $SiO_2$ by Low–Energy Ion and Neutral Beam Irradiation", *Journal of Non–Crystalline Solids* 181, 1995, pp. 123–134.

Narumi, E., et al., "Critical Current Density Enhancement in $YBa_2Cu_3O_{6.8}$ Films on Buffered Metallic Substrates", *Appl. Phys. Lett.* 58 (11), Mar. 18, 1991, pp. 1202–1204.

Norton, David P., et al., "High Critical Current Densities in $YBa_2Cu_3O_{7-x}$ Films on Polycrystalline Zirconia", *Appl. Phys. Lett.* 57 (11), Sep. 10, 1990, pp. 1164–1166.

Pangal, K. et al., "Integration of Amorphous and Polycrystalline Silicon Thin–Film Transistors Through Selective Crystallization of Amorphous Silicon", *Appl. Phys. Lett.* 75 (14), Oct. 4, 1999, pp. 2091–2093.

Reade, R.P., et al., Characterization of Y–Ba–Cu–O Thin Films and Yttria–Stabilized Zirconia Intermediate Layers on Metal Alloys Grown by Pulsed Laser Deposition, *Appl. Phys. Lett.* 59 (6), Aug. 5, 1991, pp. 739–741.

Reade, R.P., et al., "Laser Deposition of Biaxially Textured Yttria–Stabilized Zirconia Buffer Layers on Polycrystalline Metallic Alloys for High Critical Current Y–Ba–Cu–O Thin Films", *Appl. Phys. Lett.* 61 (18), Nov. 2, 1992, pp. 2231–2233.

Russo, R.E., et al., "Fabrication and Characterization of Y–Ba–Cu–O Thin–Films on Stainless–Steel Substrates", submitted by authors for publication in *High Temperature Superconducting Compounds II*, edited by S.H. Whang (Minerals, Metals, and Materials Society, Warrendale), 1990, pp. 1–6.

Russo, R.E. et al., "Metal Buffer Layers and Y–Ba–Cu–O Thin–Films on Pt and Stainless–Steel Using Pulsed Laser Deposition", *J. Appl. Phys.* 68 (3), Aug. 1, 1990, pp. 1354–1356.

Tiwari, P., et al., "In Situ Single Chamber Laser Processing of $YBa_2Cu_3O_{7-\delta}$ Superconducting Thin Films on Si (100) with Yttria–Stabilized Zirconia Buffer Layers", *Appl. Phys. Lett.* 57 (15), Oct. 8, 1990, pp. 1578–1580.

Van Wyk, G.N., "The Dependence of Ion Bombardment Induced Preferential Orientation on the Direction of the Ion Beam", *Radiation Effects Letters*, vol. 57, 1980, pp. 45–50.

Van Wyk, G.N., et al., "Ion Bombardment Induced Preferential Orientation in Polycrystalline Cu Targets", *Radiation Effects*, vol. 38, 1978, pp. 245–247.

Wang, C.P. et al., "Deposition of In–Plane Textured MgO on Amorphous $Si_2N_4$ Substrates by Ion–Beam–Assisted Deposition and Comparisons with Ion–Beam–Assisted Deposited Yttria–Stabilized–Zirconia", *Appl. Phys. Lett.* 71 (20), Nov. 17, 1997, pp. 2955–2957.

Wiesmann, J. et al.; "Large–Area of Biaxially Textured YSZ Buffer Layers Using an IBAD Process," Nuclear Instruments and Methods in Physics Research B, vol. 120, pp. 290–292, (1996).

* cited by examiner

PARTICLE BEAM BIAXIAL ORIENTATION OF A SUBSTRATE FOR EPITAXIAL CRYSTAL GROWTH

BACKGROUND OF THE INVENTION

The United States Government has certain rights in this invention. This invention was made under a CRADA (CRADA No. BG-00-441) between American Superconductor Corporation and Lawrence Berkeley National Laboratory operated for the United States Department of Energy.

1. Field of the Invention

This invention relates to epitaxial crystal growth on the surface or in the interior of a substrate. More particularly, this invention relates to a process for the formation of a biaxially ordered layer on the surface of a non-single-crystal substrate to provide a surface which permits subsequent epitaxial growth of a biaxially oriented crystalline film thereover or therein.

2. Description of the Related Art

Traditionally, high temperature superconducting thin films were grown on single crystal substrates which promote the growth of oriented epitaxial films, and the resultant structures were suitable for a limited number of electronic applications. However, such single crystal substrates are not suitable for conductor applications such as electric power transmission, magnetic energy storage, motors, or the like.

To form superconducting thin films for a greater number of conductor applications, metal substrates are typically used. Unfortunately, the metal substrate does not have the desired degree of biaxial orientation of the superconducting film as obtainable with single crystal substrates. In attempting to establish biaxial orientation and avoid metal migration from the substrate into the superconducting film (which can destroy the film's superconducting properties) an intermediate layer is usually formed over the metal substrate before depositing the superconducting film.

Several approaches have been used to promote biaxially oriented crystalline growth on substrates that do not provide an epitaxial template. In one approach, improved superconducting film orientation is attempted by depositing a buffer layer of yttria-stabilized zirconia (YSZ) or MgO using vapor deposition at an inclined angle. However, the deposited layers have a large degree of tilt towards the axis of the vapor source (~25°), and this method requires deposition of a thick intermediary layer (>1 μm) of YSZ or MgO to attain the desired degree of biaxial orientation.

Another approach for forming oriented superconductor films utilizes metallographic rolling and thermal annealing to induce biaxial orientation directly in a metal foil such as Ni metal foil. Difficulties with oxidation of the metal surface during deposition and problems transferring the epitaxial template to the superconducting film require a multilayer buffer structure between the superconductor and the substrate, resulting in increased manufacturing costs. Further, this method is limited to only a few metals, and is therefore not generally useful in forming near-single-crystal thin films using a variety substrate materials.

Another approach for fabricating superconductor tapes on flexible metal foil is ion-beam assisted deposition (IBAD) of an oriented template layer. The IBAD process utilizes oblique angle ion bombardment during the deposition of a intermediate layer, most commonly YSZ or MgO, to produce a biaxially aligned template layer. The advantage of this process is its ability to form a template layer on nearly any substrate, permitting use of a wide variety of near-single-crystal thin films on substrates that do not provide a template for epitaxial crystalline growth. However, in the case of YSZ, results have shown that the texture of the IBAD YSZ buffer layer improves with thickness, and therefore deposition time. To produce the texture necessary for superconducting tapes, thick YSZ films are needed. Since IBAD deposition rates of YSZ are typically very slow, deposition times are often too slow for practical applications.

In our previous U.S. Pat. No. 5,432,151, we disclosed an IBAD process for simultaneous deposition and orientation of a biaxially textured layer on a substrate using laser ablation to deposit the biaxially orientable material and an oblique ion beam to biaxially orient the material as it is deposited. However, it would be advantageous to provide independent control of the deposition process and the biaxial orientation process so that a material may be biaxially oriented without regard to the manner in which the biaxially orientable material was formed (e.g., deposited or grown) on an underlying substrate.

Extending beyond superconducting films, there are an increasing number of methods which include deposition of near-single-crystal quality thin films on substrates that do not provide a template for epitaxial crystalline growth. These substrates include many technically important materials such as randomly-oriented polycrystalline metal foils, amorphous insulators such as $SiO_2$, and plastics.

It would, therefore, be desirable to provide a process for forming a biaxially oriented surface on a variety of substrates, from which surface an epitaxial crystalline formation can readily be grown. The present invention achieves this goal and provides additional advantages as well.

SUMMARY OF THE INVENTION

The invention provides a method of increasing the extent of a desired biaxial orientation of a previously formed non-single-crystal structure by contacting said structure with an oblique particle beam thereby forming in the structure a nucleating surface having increased desired biaxial orientation. In one embodiment, the method further includes a step of depositing a layer onto the previously formed structure, where the layer is capable of attaining a biaxial orientation in registry with said nucleating surface. In another embodiment, the invention further includes a step of epitaxially growing the crystalline formation using the nucleating surface to promote the epitaxial growth.

The invention further provides an at least partially crystalline structure containing a nucleating surface formed by contacting a previously formed non-single-crystal structure with an oblique particle beam, and a crystalline active layer. This structure further contains 0 to 10 orientation-transmitting layers adjacent and between the nucleating surface and the active layer, where the active layer is oriented in registry with the nucleating surface.

DETAILED DESCRIPTION OF THE INVENTION

General

The process of the invention comprises bombarding a structure with a particle beam to provide biaxially aligned orientation or texturing to the surface of the structure contacted by the particle beam. Such a biaxially oriented surface, in turn, permits the epitaxial crystal growth of a layer deposited onto the biaxially oriented surface or epitaxial crystal growth into the interior of the structure containing the biaxially oriented surface. For example, formation of a biaxially oriented surface permits the deposition thereon of a biaxially oriented superconducting film that exhibits enhanced superconducting properties compared to a superconducting film formed over an intermediate layer that does not exhibit such biaxial orientation.

This new, oblique ion-beam nanotexturing process disclosed herein can produce a biaxially oriented surface suitable for use in near-single-crystal thin film growth on a wide variety of substrates, including difficult substrates that themselves do not provide such a template. The method of the invention is a direct biaxially orienting process that does not rely on the simultaneous deposition of material to establish a biaxially oriented surface. This process can be faster and more economical than processes such as ion-beam assisted deposition (IBAD) and more versatile than the metallographic rolling process proposed for superconductor tapes.

Definitions

Figure 5:
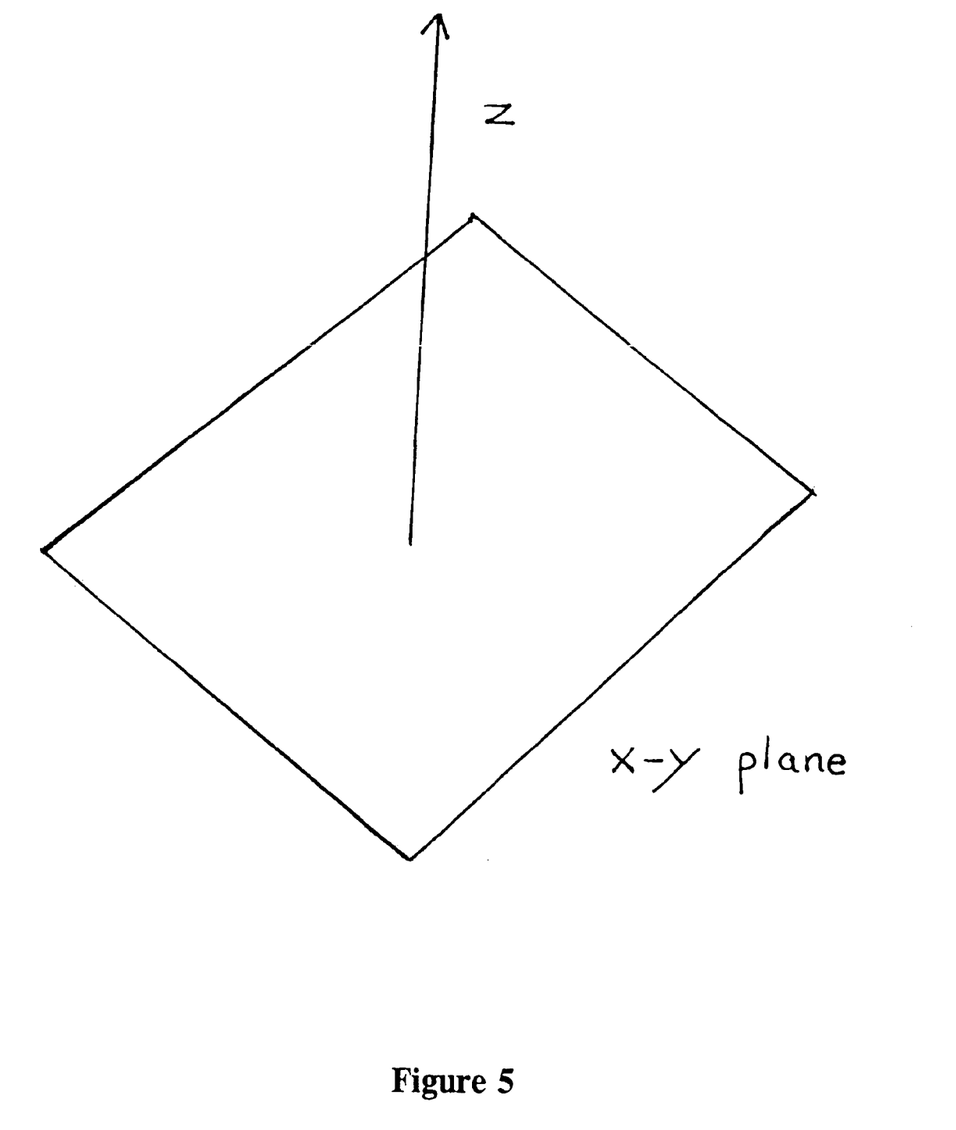
FIG. 5 is a schematic of the structure contacted by the oblique particle beam in accordance with the method of the invention showing the plane of the structure (x-y plane) and the axis normal to the plane of the structure (z-axis).

By use of the terms "biaxial orientation" or "biaxial alignment" is meant an axial alignment with respect to a z-axis normal to the plane of the structure formed by the x-axis and the y-axis, as well as alignment with respect to an axis lying in the x-y plane of the structure (FIG. 5).

As used herein, a previously formed "structure" is any solid material containing a substance that, upon contact with an oblique particle beam in accordance with the invention, increases in a desired biaxial orientation. Such a structure can comprise, for example, a substrate having one or more layers deposited thereon. In addition, such a structure can comprise the substrate itself, having no layers deposited thereon. By describing a structure as "previously formed" is meant that the portion of the structure contacted by the oblique particle beam is not being added to by a deposition step at the same time that the structure is being contacted by the oblique particle beam; thus the structure of the present invention, by being previously formed, differs fundamentally from the structure used, for example, in an IBAD process.

An "upper layer" referred to herein represents the layer of a structure that is contacted by the oblique particle beam in the method of the invention. In a preferred embodiment, the upper layer on the substrate, or the substrate itself when no layers are present thereon, is not a single-crystal layer or single-crystal substrate. The upper layer may comprise, but is not limited to, the surface portion of the structure facing the oblique particle beam. An upper layer or substrate can comprise, for example, an amorphous layer or substrate, or a polycrystalline layer or substrate.

An "oblique particle beam" used in the method of the invention is a particle beam comprising particles such as electrons, neutrons, charged atoms, uncharged atoms, charged molecules or uncharged molecules, which particle beam is directed at a non-orthogonal angle onto the structure in such a way as to cause the surface portion of the structure to develop at least partial biaxial orientation. In a preferred embodiment, the oblique particle beam is an oblique ion beam, which can contain charged atoms, charged molecules, or a combination of charged atoms and charged molecules.

In accordance with the invention, a "nucleating surface" refers to a region of an orientable structure that has been contacted or otherwise orientationally influenced by an oblique particle beam, such a region having an increased extent of a desired biaxial orientation in comparison to the extent of the desired biaxial orientation of that region prior to being contacted by the oblique particle beam. A region otherwise influenced by an oblique particle beam includes regions proximal to the region physically contacted by the particle beam which, by way of physical interactions with the physically-contacted region, also have increased extent of biaxial orientation. In one embodiment of the invention, a nucleating surface can serve as a template or seed for promoting lateral or vertical crystal growth, for example, a seed that promotes epitaxial crystal growth. Since the nucleating surface has a desired biaxial orientation, the nucleating surface can thereby act as a biaxial template in securing the biaxial orientation of a crystal grown therefrom.

A nucleating surface can be used indirectly by, for example, lying immediately adjacent one or more intermediate layers such as an orientation-transmitting layer. An "orientation-transmitting layer" as used herein refers to a layer capable of conveying the biaxial orientation of an underlayer to a further layer formed thereon. The orientation-transmitting layer lies immediately adjacent a nucleating surface of a structure, or immediately adjacent another orientation-transmitting layer provided that at least one orientation-transmitting layer is immediately adjacent the nucleating surface of the structure. In one embodiment, the orientation-transmitting layer is a cap layer that protects the underlying nucleating surface from degradation.

An "active layer" as used herein refers to a biaxially oriented layer having electrical or physical properties desired for the intended function of the final product of the method of the invention. For example, a crystalline YBCO layer formed by epitaxial crystal growth and having superconducting properties may be an active layer, while an underlying YSZ layer may not. Similarly, an "activatable layer" refers to a layer which, when biaxially oriented using the methods of the invention, has electrical or physical properties desired for the intended function of the final product. In some instances, the activatable layer can be the "upper layer". That is, the activatable layer can itself be the layer exposed to the oblique particle beam to thereby derive its biaxial orientation. In other instances, the activatable layer can be a crystallizable layer which can undergo epitaxial crystal growth in accordance with the methods of the invention.

Structure

In the method of the invention, the oblique particle beam contacts a previously formed structure comprising a biaxially orientable material. Such a structure can be partially crystalline, polycrystalline, or amorphous, provided that the structure contacted by the oblique particle beam is not a single crystal. For example, a structure can comprise a substrate, one or more lower layers and an upper layer where the substrate or one or more underlayers can be polycrystalline or a single crystal, provided that the upper layer is not a single crystal. Further, the material comprising the region of the structure contacted by the oblique particle beam must be capable of being reoriented such that, upon contact with the oblique particle beam, the region increases in the extent of a desired biaxial orientation. For example, a structure can be an amorphous silicon substrate or a metal substrate coated with an amorphous layer of a metal oxide such as yttria-stabilized zirconia (YSZ).

The "extent" of a desired or pre-selected biaxial orientation within a structure refers to the level to which the structure adopts an alignment with respect to the z-axis and an axis in the x-y plane of the structure. Thus, a structure having no ordered orientation, such as an amorphous structure, will have an increased extent of a desired biaxial orientation when at least a portion of the structure has been modified to contain therein a region having a desired biaxial orientation. Similarly, a partially crystalline or polycrystalline structure will have an increased extent of biaxial orientation when a portion of the structure has been modified to contain therein a region having a desired biaxial orientation.

Structures useful in the methods of the invention can comprise any biaxially orientable material. Such biaxially orientable materials include metals, mixed metals, rare earths, alkaline earths, semiconductors and compounds of same, including oxides, carbides, nitrides, borides, sulfides, chalcogenides and halides, and the like. Biaxially orientable materials can also include organic materials, such as organic polymers. Exemplary materials which the structure can comprise include silicon, silicon oxide, cerium oxide, zirconia, yttria stabilized zirconia, yttrium oxide ($Y_2O_3$), magnesium oxide, strontium titanate, titanium nitride, praseodymium oxide ($Pr_6O_{11}$), niobium, molybdenum, nickel and the like. Depending on the structure, it may be desirable for the upper layer of the structure contacted by the oblique particle beam to be amorphous or, alternatively, polycrystalline. For example, it may be desirable to use an amorphous metal or amorphous semiconductors such as amorphous silicon in the method of the invention.

As used herein mixed metals refer to metal compositions comprising at least about 0.01 wt. %, preferably at least about 0.1 wt. %, and most preferably at least about 1 wt. % of two or more metals. As used herein, a semiconductor refers to Group II-VI compounds such as MgS, CaSe, SrTe, BaS, ZnSe, CdTe, HgS, and the like; Group III-V compounds such as GaAs, InP, (In,Ga)As, and the like; and Group IV compounds such as silicon, germanium, and the like.

Structures used in the method of the invention are usually commercially available or can be prepared by any of a number of methods known in the art. For example, if a structure comprises a substrate with a layer deposited thereon, which layer is to be contacted by the oblique particle beam, then the layer to be contacted can be deposited using a method such as laser deposition, chemical vapor deposition, physical vapor deposition, metal organic deposition, spray pyrolysis, spin coating, evaporation, sputtering, metal organic chemical vapor deposition, electron beam evaporation, plasma enhanced chemical vapor deposition, laser ablation and the like.

In one embodiment, a structure can comprise any suitable material to which an intermediate layer or upper layer will adhere. Suitable structures can comprise any non-crystalline or polycrystalline material upon which one desires to deposit a film such as a superconductor film. For example, a structure may comprise a metal substrate such as stainless steel or a nickel-based superalloy such as Haynes Alloy #230. Other examples of suitable materials for the structure include silica glasses, polycrystalline aluminum oxide, and polytetrafluoroethylene (Teflon).

In another embodiment, oxide films are the upper layer contacted by the particle beam, particularly superconducting oxide films or other oxide material used in conjunction with the superconducting oxide film. One such oxide material which has been used to form such an upper layer is a yttria-stabilized zirconium oxide (YSZ) material. This material comprises zirconium oxide ($Zro_2$) which has been stabilized with from about 5 wt. % to about 15 wt. %, preferably about 10 wt. %, of yttrium oxide ($Y_2O_3$). Other oxides which could be used in the formation of the desired intermediate layer, by way of example, include magnesium oxide (MgO), strontium titanium oxide ($SrTiO_3$), cerium oxide ($CeO_2$), lanthanum aluminate ($LaAlO_3$), ruthenium oxide ($RuO_2$), lanthanum gallate ($LaGaO_3$), barium titanate ($BaTiO_3$), and indium oxide ($In_2O_3$) containing about 10 wt. % tin oxide ($SnO_2$). Upper layers such as the above-described oxide films can be formed by any of a number of methods known to one of skill in the art, such as laser ablation, as disclosed in U.S. Pat. No. 5,432,151, the subject matter of which is hereby incorporated by reference.

In another embodiment, the upper layer has thermal expansion properties similar to those of both the underlying layer or substrate and any layer to be deposited atop the upper layer. In accordance with this embodiment, the coefficient of thermal expansion of the upper layer can be either equal to one of the respective coefficients of thermal expansion of either the underlying layer or substrate or of the layer to be deposited over the upper layer, or lie in between the respective coefficients of thermal expansion of the underlying layer or substrate and the layer to be deposited over the upper layer.

In another embodiment, the thermal expansion properties of the upper layer can be selected in such a manner as to create a desired amount of stress in the upper layer. For example, a particular level of stress in the upper layer could provide desirable properties such as superior nucleation of epitaxial crystal growth. The thermal expansion properties of the upper layer and the underlying layer or substrate can be selected in order to attain this desired amount of stress in the upper layer. That is, layers or materials with highly mismatched thermal properties could be used if desired.

The structure can be in any physical shape or form which is desirable for the manufacture of the final product, or can be in the net shape and form of the final product itself, provided that the shape does not prevent biaxial orienting of the surface of the structure by the oblique particle beam. Such shapes include plate, wafer, continuous ribbon, and the like; and having a form that can be flat, convex, concave, and the like.

Beam

In accordance with the present invention, an orientable structure is contacted or bombarded with an oblique particle beam. Such a beam comprises particles such as electrons, neutrons, charged atoms, uncharged atoms, charged molecules or uncharged molecules, directed onto the structure in such a way as to cause the surface portion of the structure to develop at least partial biaxial orientation. It will be understood that an oblique particle beam used in the method of the invention can comprise particles such as α-particles or β-particles. The components of the beam selected for use in the method of the invention include particles that are capable of forming a biaxially oriented nucleating surface in the structure contacted by the oblique particle beam. Exemplary components of an oblique particle beam include noble gases, $O_2$, $N_2$, a component of the substrate to be contacted, or a component to be deposited into the substrate to be contacted. In one embodiment, a component of the oblique particle beam is selected for deposition into the region of the structure contacted by the oblique particle beam. For example, zirconia can be a component of the oblique particle beam if it is desired to deposit zirconia into, for example, a yttrium oxide substrate. The oblique particle beam can comprise one or more different charged or uncharged particles. For example, the beam can comprise $O_2$ and Ar, $N_2$ and $O_2$, Ne and Ar, He and $O_2$, or the corresponding charged combinations.

The oblique orientation of the particle beam, also referred to herein as the angle of incidence, will be less than 90° with respect to an axis normal to the plane of the contacted structure but greater than 0°, and will be at an angle sufficient to cause a biaxially oriented nucleating surface to form in the contacted structure. Preferably, the oblique orientation of the particle beam ranges from about 15° to about 85°, more preferably from about 30° to about 80° most preferably, from about 40° to about 70°. Typically, the oblique orientation will be about 55° for an ion beam contacting yttria stabilized zirconia, and about 45° for an ion beam contacting MgO.

The energy level of the oblique particle beam used in the method of the invention will be sufficient to promote biaxial orientation in the contacted structure without being so great as to amorphize, sputter or otherwise eliminate the biaxially oriented nucleating structure formed by the oblique particle beam in the method of the invention. For example, an energy level is considered to be too high if the material sputtering rate is greater than the biaxially orienting rate, removing biaxially oriented material as quickly as it can be formed. In contrast, an energy level is considered to be too low if the particle impacts are not sufficient to create biaxial ordering. The energy level of the oblique particle beam can vary according to the properties of the structure contacted by the particle beam, but typically, the particle beam energy level will be from about 10 eV to about 20,000 eV. Preferably, the energy level of the beam will be from about 10 eV to about 10,000 eV, more preferably from about 10 eV to about 5,000 eV, most preferably from about 10 eV to about 2,000 eV. For example, an oblique particle beam used to contact yttria stabilized zirconia can have an energy level of about 300 eV. In one embodiment, a beam can be used at an energy level that amorphizes the contacted structure, provided that this amorphization step is followed by a step of contacting the structure with an oblique particle beam in order to form the biaxially oriented nucleating surface.

A particle beam can comprise a commercially available ion beam generator capable of providing a particle beam voltage of at least about 50 volts and up to any voltage that promotes, without destroying, biaxial orientation in the contacted structure. Such a particle beam generator, for example, is commercially available from the Commonwealth Scientific Company as a Model II 3 cm ion source beam generator. The particle beam generator can include an input gas flow means through which an ionizable gas can be flowed from an external source to provide the ionized beam which is focused on the contacted structure.

Although referred to herein as a single particle beam, one of skill in the art will appreciate that one or more particle beams can be used in the method of the invention. For example, the use of two or more oblique particle beams in an appropriate configuration may increase the extent of biaxial orientation. As another example, a greater area of exposure of the structure to particle beam bombardment can be obtained by the use of more than one beam. A variety of additional methods for attaining desired coverage of the surface of the structure are known in the art and can be used in the methods of the invention; for example, the particle beam can be moved with respect to the structure contacted in "scanning" the portion of the structure that is desired to be contacted.

Temperature of Reaction

In general, the temperature of the structure while being contacted by the oblique particle beam will be a temperature at which the components of the structure, upon being contacted by the oblique particle beam, can be biaxially oriented, while components of the structure not influenced by the oblique particle beam do not develop increased crystallinity that is not aligned with the biaxially oriented surface contacted by the oblique particle beam. However, while biaxially orienting the "upper layer" of the structure, the temperature may be high enough to cause "incidental" crystallization in a lower layer or substrate provided that such crystallization does not effect or compete with the biaxial orienting or texturing of the surface of the "upper layer" by the particle beam.

In one embodiment, the temperature will be high enough to permit annealing out of defects created by the particle beam contacting the structure, while the temperature of the process will not be so high as to permit spontaneous thermal crystalline formation in regions of the structure spaced from the region of the structure contacted by the particle beam, except as mentioned above. The temperature range at which the method of the invention can be carried out will vary according to the physical properties of the region of the structure to be contacted by the particle beam, and can be empirically determined by one of skill in the art. In one embodiment, the temperature of the process can influence the desired energy level of the oblique particle beam, and, therefore, one of skill in the art will select a temperature and oblique particle beam energy level suitable for biaxially ordering the structure to be contacted. Furthermore, the temperature range may be limited by the physical or chemical temperature sensitivity of a portion of the structure. Thus, a preferred temperature is a temperature that does not result in damage to the structure.

Other Reaction Conditions

The method of the invention can be carried out in a gaseous environment with a composition of gasses at a pressure that permits biaxial orienting of the region of the structure contacted by the oblique particle beam. The particular composition of gasses and pressure selected should not significantly diminish the ability of the particle beam to form a biaxially oriented nucleating surface on the structure, by, for example, scattering the particle beam. Additionally, the composition of gasses and pressure should not be so low as to result in undesired degradation of the region of the structure contacted by the particle beam, by, for example, sputtering. If undesirable sputtering takes place, for example, preferential sputtering of oxygen, the gaseous environment of the reaction will have a sufficient level of oxygen introduced into the reaction chamber to permit replacement of the sputtered oxygen atoms.

Nucleating Surface

As a result of contacting the structure with the oblique particle beam under the conditions stated, a nucleating surface is formed in the structure, which nucleating surface is characterized as a region having an increased extent of a desired biaxial orientation in comparison to the extent of the desired biaxial orientation of that region prior to being contacted by the oblique particle beam. A nucleating surface formed in the method of the invention will preferably have a thickness that is sufficient to serve as a template or seed for nucleating epitaxial crystal growth. Typically, the nucleating surface will be at least one monolayer in thickness, and can be as much as 100 nm thick. Preferably, the nucleating surface will be about 0.5 nm to about 10 nm in thickness.

Epitaxial Crystal Growth—General

In a preferred embodiment, the nucleating surface can be used to promote or nucleate epitaxial crystal growth in forming a crystalline active layer. Use of a nucleating surface to promote epitaxial crystal growth refers to the direct or indirect application of a nucleating surface in serving as a biaxially oriented template from which a crystalline formation is grown in a crystallizable layer. For example, a nucleating surface can serve to directly nucleate crystal growth by lying immediately adjacent a less oriented crystallizable layer and thereby serving as a template for crystal growth within the less oriented layer. As used herein, layers that are "adjacent" one another refers to layers that contact one another. For example, an upper layer lying directly on top of a lower layer is adjacent the lower layer. Adjacent layers can also intercalate with one another such that some or all of the adjacent layers lie in the same plane, which plane is substantially parallel to the plane of the substrate surface. A nucleating surface further can indirectly nucleate crystal growth. Indirect nucleation can occur when one or more intermediate layers lie between the nucleating layer and the crystallizable layer. Such an intermediate layer will typically be biaxially oriented in registry with the nucleating layer, thus serving as an orientation-transmitting layer, as previously defined and as will be described in more detail below. In both instances of direct and indirect use of nucleating surfaces, it will be understood that the orientation of the crystal growth originates from the nucleating surface. As used herein, when a structure comprises zero orientation-transmitting layers, the nucleating surface lies immediately adjacent the crystallizable layer. Epitaxial crystal growth can be carried out by any of a variety of methods known in the art, including epitaxial crystal growth by deposition and solid phase epitaxial crystal growth.

Epitaxial Crystal Growth—By Deposition

Figure 1:
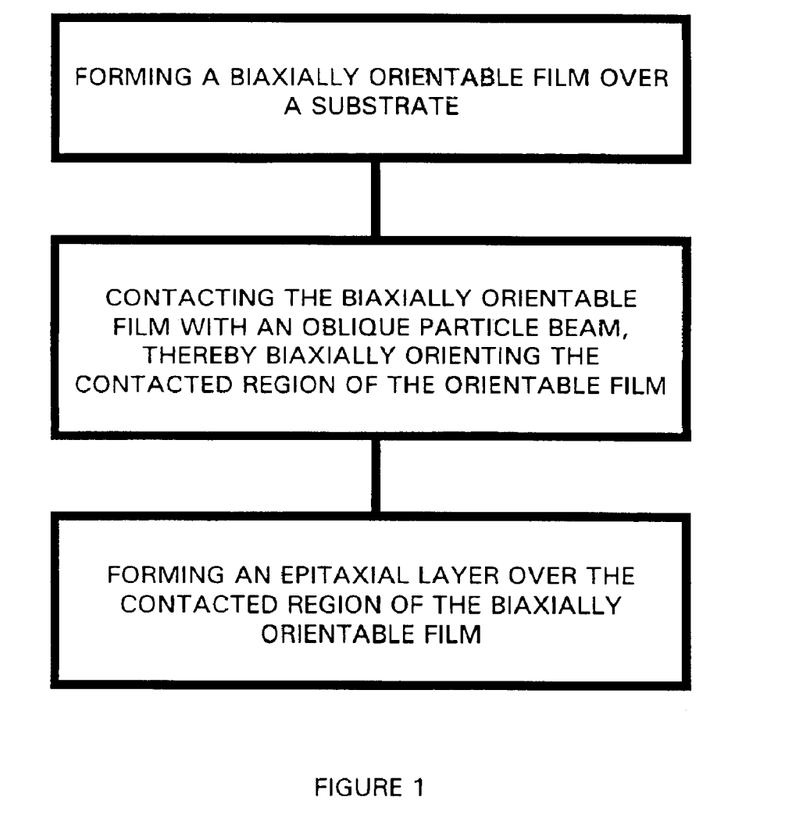
FIG. 1 is a flow diagram showing an embodiment of the method of the invention, where epitaxial growth is carried out over a biaxially orientable film after contacting the film with an oblique particle beam.
Figure 2:
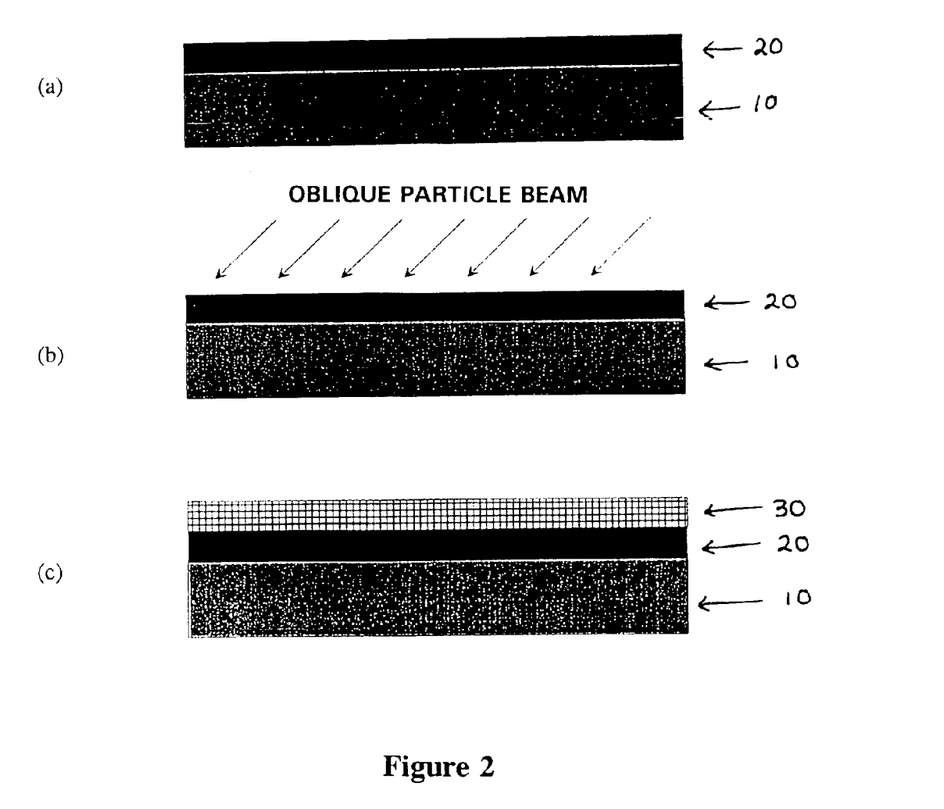
FIG. 2 is a schematic depicting an embodiment of the method of the invention, where (a) a biaxially orientable layer 20 is deposited onto a substrate 10, (b) the biaxially orientable layer is bombarded with an oblique particle beam to form a nucleating surface in the biaxially orientable layer, and (c) a crystallizable layer 30 is deposited over the nucleating surface, whereby the nucleating surface promotes epitaxial crystal growth in the crystallizable layer.

In one embodiment of the invention, a crystallizable layer is deposited onto the structure, and the nucleating surface promotes epitaxial crystal growth in the crystallizable layer (FIGS. 1 and 2). For example, the crystallizable layer can adopt biaxial orientation as the layer is deposited onto the structure. Alternatively, the crystallizable layer can be first deposited onto the structure, and then subjected to conditions that permit epitaxial crystal growth promoted by the nucleating surface, for example, increased temperature. The crystallizable layer can be deposited directly onto the nucleating surface or can be deposited onto an intermediate layer in registry with the nucleating surface, such as an orientation-transmitting layer.

Turning to FIG. 1, a flow diagram depicts the embodiment of the method of the invention in which epitaxial growth is carried out over a biaxially orientable film after contacting the film with an oblique particle beam. FIG. 2 shows the structures formed in the flow diagram described in FIG. 1.

In this embodiment, a biaxially orientable film 20 is first deposited over a substrate 10, or, alternatively, a substrate with layers thereon. Second, the biaxially orientable film 20 is contacted with an oblique particle beam under conditions at which the contacted region of the orientable film adopts a desired biaxial orientation, thus forming a nucleating surface. Finally, a crystallizable layer 30 is deposited over the nucleating surface, and epitaxial growth promoted by the nucleating surface is carried out in the crystallizable layer 30.

Deposition of the crystallizable layer can be carried out using any deposition method known in the art for depositing crystallizable layers for the purpose of epitaxial crystal growth. For example, deposition can be carried out using a method such as laser deposition, chemical vapor deposition, physical vapor deposition, metal organic deposition, spray pyrolysis, spin coating, evaporation, sputtering, metal organic chemical vapor deposition, electron beam evaporation, plasma enhanced chemical vapor deposition, laser ablation, and the like. For example, a superconducting YBCO layer can be deposited according the methods disclosed in U.S. Pat. No. 5,432,151.

A crystallizable layer used in the methods of the invention can comprise any material that is capable of attaining crystalline structure, and thereby form a crystalline active layer. Such crystallizable layers include metals, mixed metals, rare earths, alkaline earths, semiconductors and compounds of same, including oxides, carbides, nitrides, borides, sulfides, chalcogenides and halides, and the like. A crystallizable layer can also include organic materials, such as organic polymers. Exemplary materials which the crystallizable layer can comprise include high temperature superconductors such as $YBa_2Cu_3O_{7-\delta}$ (where $\delta$ is greater than 0 and less than 0.5), $REZ_2Cu_3O_{7-\delta}$ (where RE is a rare earth or yttrium, Z is an alkaline earth element, and $\delta$ is greater than 0 and less than 0.5), Bi—Sr—Ca—Cu—O, Tl—Ba—Ca—Cu—O, and the like; oxides such as $SrTiO_3$, $Y_2O_3$, $RuO_2$, $ZrO_2$, $SiO_2$, yttria-stabilized zirconia (YSZ), $CeO_2$, $Al_2O_3$, and the like; semiconductors such as Si, Ge, InP, GaSb, InSb, GaAs, InAs, (In,Ga)As, CdS, and the like; magnetic and magnetorestrictive materials such as $LaMnO_3$, Fe, NiO, Co, Ni, and the like; coatings for tribological or hardness applications such as SiC, TiN, diamond and diamond-like coatings, and the like, and sensor materials such as ZnO, lead-zirconite-titanate, and the like.

A crystallizable film deposited in the method of the invention can include the high temperature superconducting ceramic materials such as $YBa_2Cu_3O_{7-\delta}$ (where $\delta$ is greater than 0 and less than 0.5). Other such superconducting ceramic materials include bismuth-strontium-calcium-copper oxides, thallium-calcium-barium-copper oxides, bismuth-lead-strontium-copper oxides, and thallium-calcium-barium-lead-copper oxides. Another example of a superconducting ceramic oxide, where copper is omitted, is a barium-potassium-bismuth oxide. Usually such superconducting films as described above are formed to a thickness ranging from about 10 nm to about 5,000 nm. However, even thicker layers, up to as high as 10 micrometers ($\mu$m) or higher, are possible and may be desirable in some applications.

Epitaxial Crystal Growth—Within Body of Substrate

In another embodiment of the invention, epitaxial crystal growth can be carried out beneath the nucleating surface and into one or more crystallizable layers underlying the nucleating surface. Such a crystallizable underlayer can be directly adjacent the nucleating layer or separated from the nucleating layer by one or more intermediate layers provided that the epitaxial growth that occurs in the crystallizable underlayer is in registry with the biaxial orientation of the nucleating surface.

In accordance with this method, subsequent to formation of the nucleating surface, the structure is placed under conditions that permit at least a portion of the structure underlying the nucleating surface to develop crystalline formation in registry with the nucleating surface. Conditions that promote crystal growth comprise a range of temperatures, pressures and atmospheric compositions that permit structural reorganization of the portion of the structure targeted for epitaxial crystal growth. For example, subsequent to the formation of the nucleating surface, the temperature can be increased to a point at which a layer adjacent to the nucleating surface can form a crystalline structure nucleated or seeded by the nucleating surface. While the present epitaxial growth has been described as subsequent to the formation of the nucleating surface, it will be understood that, provided sufficient nucleating surface has already been formed, the step of epitaxial crystal growth beneath the surface of the nucleating surface can begin prior to the termination of the step of forming the nucleating structure.

A crystallizable underlayer used in the methods of the invention can comprise any material that is capable of attaining crystalline structure, and can be either a layer deposited above the substrate but below the nucleating surface or can be the substrate itself. Such crystallizable underlayers include metals, mixed metals, rare earths, alkaline earths, semiconductors and compounds of same, including oxides, carbides, nitrides, borides, sulfides, chalcogenides and halides, and the like. A crystallizable underlayer can also include organic materials, such as organic polymers. Exemplary materials which the crystallizable underlayer can comprise include high temperature superconductors such as $YBa_2Cu_3O_{7-\delta}$ (where $\delta$ is greater than 0 and less than 0.5), $REZ_2Cu_3O_{7-\delta}$ (where RE is a rare earth or yttrium, Z is an alkaline earth element, and $\delta$ is greater than 0 and less than 0.5), Bi—Sr—Ca—Cu—O, Tl—Ba—Ca—Cu—O, and the like; oxides such as $SrTiO_3$, $Y_2O_3$, $RUO_2$, $ZrO_2$, $SiO_2$, yttria-stabilized zirconia (YSZ), $CeO_2$, $Al_2O_3$, and the like; semiconductors such as Si, Ge, InP, GaSb, InSb, GaAs, InAs, (In,Ga)As, CdS and the like; magnetic and magnetorestrictive materials such as $LaMnO_3$, Fe, NiO, Co, Ni, and the like; coatings for tribological or hardness applications such as SiC, TiN, diamond and diamond-like coatings, and the like, and sensor materials such as ZnO, lead-zirconite-titinate, and the like.

In one embodiment, subsequent to epitaxial crystal growth, the nucleating surface can be treated in such a way as to either remove the nucleating surface or to otherwise degrade the biaxial orientation of the nucleating surface. Thus, an upper layer comprising a nucleating surface can be used to promote epitaxial crystal growth in an underlying layer and/or substrate, and then the upper layer can be removed in order to deposit a new layer atop the newly crystallized lower layer or substrate.

Orientation-Transmitting Layer

A nucleating surface can be used to indirectly promote crystal growth by lying immediately adjacent one or more orientation-transmitting layers biaxially oriented in registry with the nucleating surface, where at least one orientation-transmitting layer lies adjacent the crystallizable layer. Thus, an orientation-transmitting layer is capable of, for example, conveying the biaxial orientation of an underlying nucleating surface to a crystallizable layer formed thereon. Accordingly, if an orientation-transmitting layer contacts a crystallizable layer, the orientation-transmitting layer can serve as a template for crystal growth within the crystallizable layer.

Formation of a layer "in registry" with the nucleating surface of the structure occurs when the biaxial orientation of the layer is determined by the biaxial orientation of the nucleating surface. For example, an orientation-transmitting layer can be formed immediately adjacent a nucleating surface in such a way that the biaxial orientation of the orientation-transmitting layer is identical to the biaxial orientation of the nucleating surface. Similarly an orientation-transmitting layer formed adjacent another orientation-transmitting layer can be oriented in registry with the adjacent orientation-transmitting layer which is ultimately ordered in registry with the nucleating surface of the structure. Further, crystallizable layers that develop crystalline orientation in accordance with the invention will develop in registry with the nucleating surface, where this registry is brought about by direct contact between the crystallizable layer with the nucleating surface or is brought about by contact between a crystallizable layer and an orientation-transmitting layer that is in registry with the nucleating surface.

As used herein, an orientation-transmitting layer is also in registry with a nucleating surface when the biaxial orientation of the orientation-transmitting layer is different from that of the nucleating surface, so long as the biaxial orientation of the orientation-transmitting layer is determined by the biaxial orientation of the nucleating surface. For example, an orientation transmitting layer can be offset in the x-y plane of the structure by having a crystal lattice axis lie, for example, 45° with respect to a crystal lattice axis of the adjacent nucleating surface.

An orientation-transmitting layer used in the methods of the invention can comprise any material that is capable of attaining biaxial orientation in registry with the nucleating surface, and an orientation-transmitting layer may additionally have one or more desirable properties such as acting as a stabilizing layer, a buffer layer or an adhesion layer, as discussed below. Such an orientation-transmitting layer can comprise metals, mixed metals, rare earths, alkaline earths, semiconductors and compounds of same, including oxides, carbides, nitrides, borides, sulfides, chalcogenides and halides, and the like. An orientation-transmitting layer can also include organic materials, such as organic polymers. Exemplary materials which the orientation-transmitting layer can comprise include silicon, silicon oxide, cerium oxide, zirconia, yttria stabilized zirconia, $Y_2O_3$, magnesium oxide, strontium titanate, titanium nitride, $Pr_6O_{11}$, Nb, Mo, Ni, and the like.

Other Layers—Adhesion, Buffer, Etc.

Another embodiment of the present invention is the use of an intermediate layer that facilitates bonding between two layers, which intermediate layer serves as an adhesion layer. For example, when an upper layer to be contacted by the oblique particle beam does not bond well with an underlying layer or substrate, an adhesion layer can be used to facilitate bonding of the upper layer to the underlying layer or substrate.

Still another embodiment of the present invention is the use of a layer that acts as a "buffer layer" between the nucleating surface and the crystallizable layer. Such a buffer layer reduces or prevents property-degrading chemical interactions between two layers. For example, a buffer layer can lie between a nucleating surface and a crystallizable layer, or a buffer layer can lie between a substrate and a crystallizable layer or a substrate and the upper layer contacted by the particle beam. Such property-degrading chemical reactions reduced by the buffer layer include metal migration. For example, migration can occur from a metal substrate to a superconducting film, resulting in lessened superconducting properties of the superconducting film. Among the materials suitable as a buffer layer are cerium oxide, yttrium oxide and other cubic oxide materials such as those described in U.S. Pat. No. 5,262,394, by Wu et al. for "Superconductive Articles Including Cerium Oxide Layer" such description hereby incorporated by reference.

If it is desirable for the upper layer to serve as a buffer layer, the thickness of the upper layer must be sufficient to prevent the undesirable migration of materials in the underlying substrate or an underlying layer into the crystallizable layer to be deposited thereover. The thickness of this upper layer will be greater than about 10 nm if it is to serve as a buffer layer. Preferably, the thickness of the upper layer will be at least about 50 nm, and more preferably the thickness will be at least about 100 nm, and typically the average thickness will range from at least about 200 nm to about 1000 nm. The thickness of the upper layer will depend on the properties of the upper layer. In some instances, the upper layer may be even thicker than 1000 nm, provided that the upper layer is still capable of functioning as the desired buffer layer.

Similarly, in another embodiment, a layer can be used that acts as a "stabilizing layer." Such a stabilizing layer serves to stabilize the biaxial orientation of an underlying layer. For example, a stabilizing layer can be deposited atop a nucleating surface where a nucleating surface contains a biaxial orientation that is susceptible to degradation as a result of the nucleating surface being chemically or physically unstable or as a result of exposure to environmental conditions that can degrade the nucleating surface. Thus, a stabilizing layer can be an orientation-transmitting layer that maintains biaxial orientation in registry with an unstable underlying nucleating surface and/or protects the underlying nucleating surface from degradation.

In another embodiment, the method of the invention can be carried out in conjunction with one or more etching steps, wherein the resultant product will contain a patterned material having a desired biaxial orientation. Such an etching step can be carried out prior to, or subsequent to, the step of contacting the structure with a biaxially oriented particle beam. Etching steps useful in the method of the invention are known in the art and include, for example, anisotropic (dry) etching, isotropic (wet) etching, and the like.

The following examples will serve to further illustrate the process of the invention.

EXAMPLE I

This example shows a technique to produce a template for near-single-crystal films on difficult substrates using oblique ion beam bombardment in accordance with the invention to produce biaxial orientation in the near-surface region of a film overlying a substrate, followed by deposition of a superconducting film onto the biaxially oriented surface, resulting in a biaxially oriented superconducting film.

A mechanically polished (0.05 $\mu$m alumina final polish) Haynes Alloy 230 substrate was coated with yttria-stabilized zirconia (YSZ) using pulsed-laser deposition under conditions to produce an amorphous layer (room temperature, <$10^{-6}$ torr vacuum) as described in U.S. Pat. No. 5,432,151 and Reade et al., Appl. Phys. Lett. 59, 739–741 (1991), both of which are incorporated herein by reference. This amorphous YSZ layer was then subjected to 300 eV $Ar^+$ion bombardment at an angle approximately 55° from the axis normal to the surface of the substrate for 1.5 min. at a pressure of 0.8 mtorr (50% Ar, 50% $O_2$). The penetration depth of oblique 300 eV $Ar^+$is believed to be about 1–2 nm, so only a thin layer near the surface is probably modified. Finally, a $YBa_2Cu_3O_{7-\delta}$ (YBCO) thin film was deposited using a standard pulsed-laser deposition process (Reade et al., supra).

Figure 3:
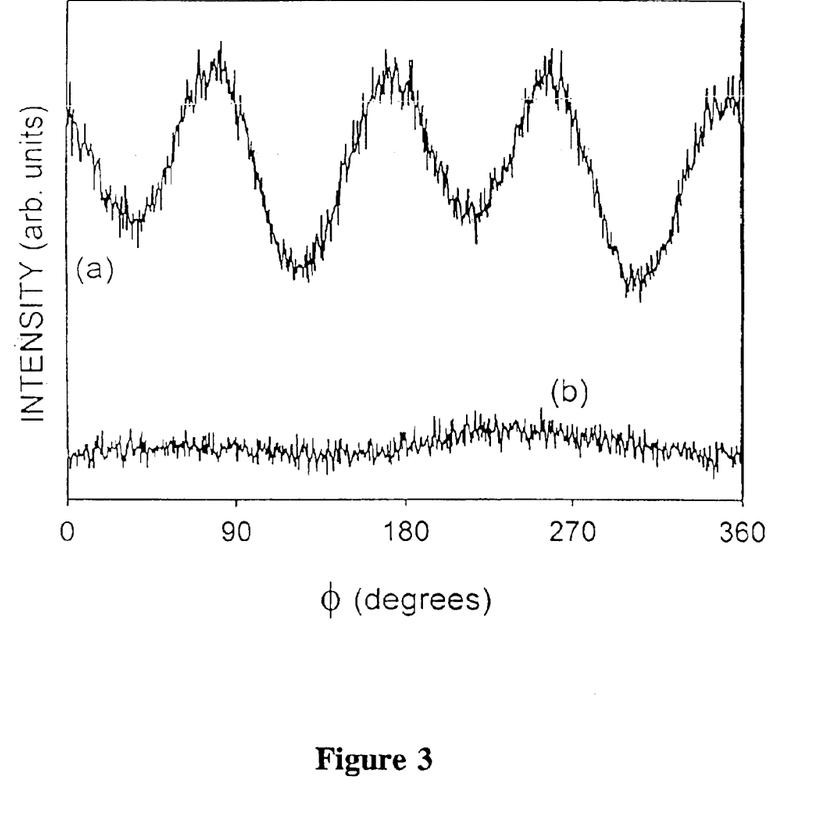
FIG. 3 is a plot showing (103) φ-scans from YBCO thin films on (a) ion-beam bombarded amorphous YSZ and (b) non-ion-beam-bombarded amorphous YSZ.

An in-situ reflection high energy electron diffraction (RHEED) image from the surface of the YSZ layer after ion beam bombardment shows that crystallinity is induced at the surface of the previously amorphous YSZ surface. The azimuth of the RHEED beam was perpendicular to the azimuth of the ion beam in this analysis. The pattern shows that the incident electron beam is parallel to a (110) YSZ axis, as expected for a (001) YSZ surface. A rotation of the sample in the plane of the film shows a four-fold symmetry, with the expected (100) pattern 45° from the (110) axis, thus verifying that a (001) film surface has been created with biaxial orientation in the plane of the film. A (103) $\phi$-scan of the YBCO layer demonstrates that in-plane orientation was established in the YBCO film deposited on the ion-beam bombarded YSZ surface (at (a) in FIG. 3). For comparison, a sample was made with an otherwise identical process but without ion-beam bombardment. This sample did not exhibit evidence of in-plane orientation in a $\phi$-scan (at (b) in FIG. 3).

Figure 4:
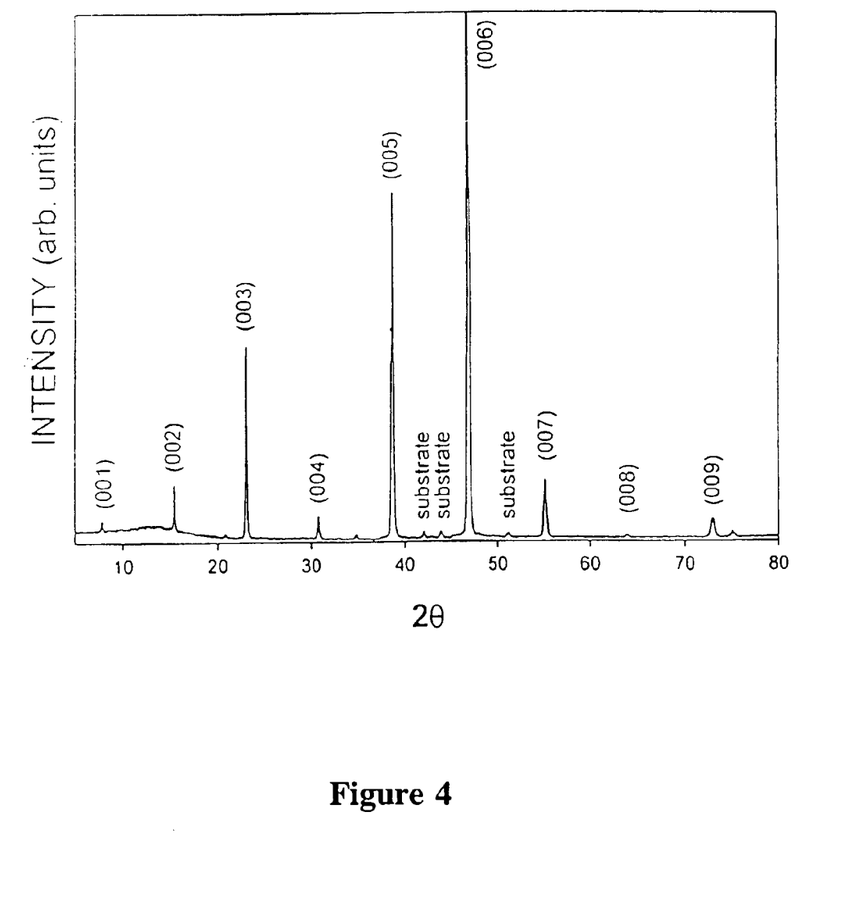
FIG. 4 is a plot showing x-ray diffraction from YBCO/ ion-beam bombarded-YSZ/Haynes Alloy #230 sample, demonstrating strong (001) YBCO peaks.

To further establish that the oblique ion bombardment produced a (001) oriented YSZ surface, a Bragg-Bretano x-ray diffraction pattern was collected; the diffraction pattern shows that the ion-beam bombarded YSZ surface provided a suitable template for strong c-axis crystallization of the YBCO film (FIG. 4). A pattern generated for the sample that was not exposed to ion-beam bombardment showed peak intensities that were less than 25% of those for the ion-beam bombarded sample. Note that the broad hump in the diffraction patterns at low 2θ angles indicates that the YSZ material is still largely amorphous beneath the biaxially oriented surface, even after ion beam bombardment.

An atomic force microscopy image of the ion-beam bombarded YSZ surface shows 20–40 nm features that do not appear on the untreated surface. These features can be attributed to crystallization of small YSZ grains on the surface, induced by the ion-beam bombardment.

EXAMPLE II

This example shows a technique to produce a template for near-single-crystal growth beneath the surface of a Si film overlying a substrate using oblique ion beam bombardment in accordance with the invention to produce biaxial orientation in the near-surface region of a film overlying a substrate, followed by an annealing step, resulting in a biaxially oriented Si film.

A hydrogenated amorphous silicon film (a-Si:H) can be deposited onto a Corning 1737 glass substrate to a thickness of 150 nm using plasma-enhanced chemical vapor deposition using methods known in the art (Pangal et al., Appl. Phys. Lett. 75 2091–2093 (1999)). A 120 nm thick capping layer of silicon nitride is then deposited onto the a-Si:H film by plasma-enhanced chemical vapor deposition. The silicon nitride layer is then patterned by wet etching. The structure can then be subjected to 100–300 eV $A^+$and/or $H^+$ion bombardment at an oblique angle for 1–2 minutes at a pressure of 1.0 mtorr. Crystallization may be then carried out by annealing the a-Si:H film under $N_2$ at 600° C. for about 4 hours. Monitoring of crystal growth is carried out using UV reflectance measurement. After crystallization, the silicon nitride capping layer is removed using dilute HF. The final structure will contain biaxially oriented crystalline silicon in the regions exposed to the ion bombardment and amorphous silicon in the regions capped by the silicon nitride layer.

While specific embodiments of the process of the invention have been illustrated and described for carrying out the invention, modifications and changes of the apparatus, parameters, materials, etc. used in the process will become apparent to those skilled in the art, and it is intended to cover in the appended claims all such modifications and changes which come within the scope of the invention.

Having thus described the invention what is claimed is:

1. A method of increasing the extent of a desired biaxial orientation of a previously formed non-single-crystal structure comprising the steps of:
   (a) contacting said structure with an oblique particle beam thereby forming in said structure a nucleating surface having increased desired biaxial orientation; and
   (b) depositing a layer onto said previously formed structure, which layer is capable of attaining a biaxial orientation in registry with said nucleating surface
   (c) wherein at least one said step of contacting said structure with an oblique particle beam is not carried out simultaneously with carrying out deposition on said structure.

2. A method of increasing the extent of a desired biaxial orientation of a previously formed non-single-crystal structure comprising contacting said structure with an oblique particle beam thereby forming in said structure a nucleating surface having increased desired biaxial orientation; wherein the energy level of said oblique particle beam is from about 10 eV to about 20,000 eV.

3. The method of claim 2, wherein said nucleating surface is capable of promoting epitaxial crystal growth.

4. The method of claim 3, further comprising the step of epitaxially growing a crystalline formation using said nucleating surface to promote the epitaxial growth.

5. The method of claim 2, wherein said structure comprises a lower substrate layer and an upper layer thereon, said structure oriented such that said oblique particle beam contacts said upper layer.

6. The method of claim 2, further comprising the step of depositing an orientation-transmitting layer adjacent said nucleating surface, whereby said orientation-transmitting layer is biaxially oriented in registry with said nucleating surface.

7. The method of claim 6, wherein said step of depositing an orientation-transmitting layer is carried out subsequent to said contacting step.

8. The method of claim 6, wherein said method comprises a plurality of steps of depositing an orientation-transmitting layer.

9. The method of claim 2, wherein the region of said structure contacted by said oblique particle beam is amorphous or polycrystalline.

10. The method of claim 9, wherein the composition of said amorphous or polycrystalline region is selected from the group consisting of $CeO_2$, Ni, MgO. Si, silicon oxide, zirconia, yttria stabilized zirconia, $Y_2O_3$, strontium titanate, titanium nitride, $Pr_6O_{11}$, Nb, and Mo.

11. The method of claim 2, wherein said oblique particle beam comprises particles selected from the group consisting of charged atoms, uncharged atoms, charged molecules and uncharged molecules.

12. The method of claim 2, wherein said oblique particle beam is directed toward said structure at an angle of incidence of from about 15° to about 85°.

13. The method of claim 12, wherein said oblique particle beam is directed toward said structure at an angle of incidence of from about 30° to about 80°.

14. The method of claim 12, wherein said oblique particle beam is directed toward said structure at an angle of incidence of from about 40° to about 70°.

15. The method of claim 12, wherein said oblique particle beam is directed toward said structure at an angle of incidence of from about 45° to about 65°.

16. The method of claim 2, wherein said step of contacting comprises bombarding said structure with said particle beam at an energy of from about 10 eV to about 5,000 eV.

17. The method of claim 2, wherein particles from said oblique particle beam are implanted into said structure.

18. The method of claim 2, wherein said particles are selected from the group consisting of a noble gas, a component of said structure, oxygen, nitrogen, an atom to be implanted into said structure, and a molecule to be implanted into said structure.

19. The method of claim 2, wherein a thickness of said nucleating surface ranges from about 1 monolayer to about 100 nm.

20. A method of growing a biaxially oriented crystalline formation comprising the steps of:
    (a) contacting a previously formed non-single-crystal orientable structure with an oblique particle beam, thereby forming in said structure a nucleating surface having increased biaxial orientation; and
    (b) epitaxially growing said crystalline formation using said nucleating surface to promote the epitaxial growth;
    (c) wherein at least one said step of contacting said structure with an oblique particle beam is not carried out simultaneously with carrying out deposition on said structure.

21. The method of claim 20 wherein said nucleating surface is adjacent one or more orientation-transmitting layers biaxially oriented in registry with said nucleating surface, and said epitaxial growth originates adjacent at least one of said orientation-transmitting layers.

22. The method of claim 21, wherein the composition of at least one of said one or more orientation-transmitting layers is selected from the group consisting of silicon, silicon oxide, cerium oxide, zirconia, yttria stabilized zirconia, $Y_2O_3$, magnesium oxide, strontium titanate, titanium nitride, $Pr_6O_{11}$, Nb, Ni, and Mo.

23. The method of claim 20 wherein said step of epitaxially growing a crystalline formation comprises depositing a crystallizable layer onto said structure whereby said nucleating surface promotes the epitaxial crystal growth in said crystallizable layer.

24. The method of claim 23, wherein said depositing is carried out using a method selected from the group consisting of chemical vapor deposition, plasma enhanced chemical vapor deposition, physical vapor deposition, laser ablation, laser deposition, sputtering, metal organic deposition, spray pyrolysis, spin coating, web coating, evaporation, metal organic chemical vapor deposition, and electron beam evaporation.

25. The method of claim 23, wherein the composition of said crystallizable layer is selected from the group consisting of $REBa_2Cu_3O_{7-\delta}$ (where RE is a rare earth or yttrium, and δ is greater than 0 and less than 0.5), Bi—Sr—Ca—Cu—O, Tl—Ba—Ca—Cu—O, $SrTiO_3$, $Y_2O_3$, $RuO_2$, $ZrO_2$, $SiO_2$, yttria-stabilized zirconia (YSZ), $CeO_2$, $Al_2O_3$, Si, Ge, InP, GaSb, InSb, GaAs, InAs, (In,Ga)As, CdS, $LaMnO_3$, Fe, NiO, Co, Ni, SiC, TiN, diamond, diamond-like coatings, ZnO, and lead-zirconite-titanate.

26. The method of claim 25, wherein said RE is yttrium.

27. The method of claim 23, wherein the composition of said crystallizable layer consists of $REZ_2CU_3O_{7-\delta}$, where RE is a rare earth or yttrium, Z is an alkaline earth element, and $\delta$ is greater than 0 and less than 0.5.

28. The method of claim 20 wherein said step of epitaxially growing a crystalline lattice comprises epitaxially growing a crystalline formation beneath said nucleating surface of said structure whereby said nucleating surface promotes the epitaxial crystal growth of said crystalline formation.

29. The method of claim 28, wherein said step of epitaxially growing a crystalline formation within the body of said structure is carried out by annealing said structure.

30. The method of claim 28, wherein the composition within the body of said structure is selected from the group consisting of $REZ_2Cu_3O_{7-\delta}$ (where RE is a rare earth or yttrium, Z is an alkaline earth element, and $\delta$ is greater than 0 and less than 0.5), Bi—Sr—Ca—Cu—O, Tl—Ba—Ca—Cu—O, $SrTiO_3$, $Y_2O_3$, $RuO_2$, $ZrO_2$, $SiO_2$, yttria-stabilized zirconia (YSZ), $CeO_2$, $Al_2O_3$, Si, Ge, InP, GaSb, InSb, GaAs, InAs, (In,Ga)As, CdS, $LaMnO_3$, Fe, NiO, Co, Ni, SiC, TiN, diamond and diamond-like coatings, ZnO, and lead-zirconite-titanate.

31. The method of claim 30, wherein said step of epitaxially growing a crystalline lattice is followed by a step of removing said nucleating surface.

32. A method of crystal growth comprising the step of epitaxially growing a crystalline lattice nucleated by a biaxially oriented portion of a structure, wherein said biaxially oriented portion is formed by contacting said structure with an oblique particle beam, wherein at least one said step of contacting said structure with an oblique particle beam is not carried out simultaneously with carrying out deposition on said structure.

33. A method of increasing the extent of a desired biaxial orientation of a previously formed non-single-crystal structure comprising contacting said structure with an oblique particle beam thereby forming in said structure a nucleating surface having increased desired biaxial orientation, wherein said structure is selected from the group consisting of metal oxides, metal carbides, metal nitrides, metal borides, metal sulfides, metal chalcogenides, metal halides mixed metals, mixed metal oxides, mixed metal carbides, mixed metal nitrides, mixed metal borides, mixed metal sulfides, mixed metal chalcogenides, mixed metal halides, rare earths, rare earth oxides, rare earth carbides, rare earth nitrides, rare earth borides, rare earth sulfides, rare earth chalcogenides, rare earth halides, alkaline earths, alkaline earth oxides, alkaline earth carbides, alkaline earth nitrides, alkaline earth borides, alkaline earth sulfides, alkaline earth chalcogenides, alkaline earth halides, semiconductors, semiconductor oxides, semiconductor nitrides, semiconductor carbides, semiconductor borides, semiconductor sulfides, semiconductor chalcogenides, semiconductor halides, and organic polymers, wherein at least one said step of contacting said structure with an oblique particle beam is not carried out simultaneously with carrying out deposition on said structure.

34. An at least partially crystalline structure comprising:
(a) a nucleating surface formed by contacting a previously formed non-single-crystal structure with an oblique particle beam;
(b) from 0 to 10 adjacent orientation-transmitting layers; and
(c) a crystalline active layer;
wherein said 0 to 10 orientation-transmitting layers are adjacent said nucleating surface and are adjacent said active layer, whereby said active layer is oriented in registry with said nucleating surface,
(d) wherein at least one said step of contacting said structure with an oblique particle beam is not carried out simultaneously with carrying out deposition on said structure.

35. The method of either of claim 1, 2, 20 or 33 wherein two particle beams are used.

36. The method of either of claim 1, 2, 20 or 33 wherein a plurality of particle beams are used.

37. The method of either of claim 1, 2, 20 or 33 wherein multiple particle beams are used.

38. The method of either of claim 1, 2, 20 or 33 wherein the particle beam is moved during bombardment.

39. A method of contacting a previously formed non-single-crystal structure with an oblique particle beam comprising:
contacting said structure with an oblique particle beam having a first component;
whereby the first component is deposited into the structure;
wherein at least one said step of contacting said structure with an oblique particle beam is not carried out simultaneously with carrying out deposition on said structure.

40. The method of claim 39 wherein the first component is zirconia.

41. The method of claim 40 wherein multiple particle beams are used.

42. The method of either of claim 1, 2, 20, 33 or 39 wherein the oblique particle beam comprises one or more charged or uncharged particles selected from the group consisting of $O_2$, Ar, $N_2$, Ne and He.

* * * * *